(12) United States Patent
Cho et al.

(10) Patent No.: US 7,473,932 B2
(45) Date of Patent: Jan. 6, 2009

(54) ORGANIC LIGHT EMITTING DEVICE AND METHOD OF MANUFACTURING THE SAME

(75) Inventors: Sang-Hwan Cho, Suwon-si (KR); Yoon-Chang Kim, Suwon-si (KR); Young-Woo Song, Suwon-si (KR); Ji-Hoon Ahn, Suwon-si (KR); Jong-Seok Oh, Suwon-si (KR); Joon-Gu Lee, Suwon-si (KR); So-Young Lee, Suwon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 169 days.

(21) Appl. No.: 11/243,127

(22) Filed: Oct. 4, 2005

(65) Prior Publication Data

US 2006/0071233 A1    Apr. 6, 2006

(30) Foreign Application Priority Data

Oct. 5, 2004   (KR)   ............... 10-2004-0079239
Oct. 5, 2004   (KR)   ............... 10-2004-0079240

(51) Int. Cl.
*H01L 29/18*   (2006.01)

(52) U.S. Cl. .................. 257/88; 257/89; 257/40; 257/98; 438/99

(58) Field of Classification Search ............... 257/40, 257/88, 89, 91, 98, 99, 100; 438/26–29, 438/32, 34, 35, 42, 99; 313/504–506
See application file for complete search history.

(56) References Cited

U.S. PATENT DOCUMENTS 6,544,902 B1 * 4/2003 Farnworth ................. 438/781

(Continued)

FOREIGN PATENT DOCUMENTS

CN   1411325 A   4/2003

(Continued)

OTHER PUBLICATIONS

Cabrera et al., "Absorption and Scattering Coefficients of Titanium Dioxide Particulate Suspensions in Water," Journal of Phaysical Chemistry, 1996, pp. 20043-30050.*

(Continued)

*Primary Examiner*—Zandra Smith
*Assistant Examiner*—Paul E Patton
(74) *Attorney, Agent, or Firm*—Knobbe Martens Olson & Bear LLP (57) ABSTRACT

An organic light emitting device (OLED) and a method for manufacturing the same are disclosed. In one embodiment, the OLED includes i) a pixel layer having a first electrode, a second electrode, and a light emitting portion interposed between the first electrode and the second electrode and having at least an emission layer, ii) a transparent member disposed in a direction in which light generated from the pixel layer is transmitted, iii) a diffraction grating disposed between the pixel layer and the transparent member, and iv) a low-refractive layer made of a material having a refractive index less than that of a material forming the transparent member, the low-refractive layer disposed between the diffraction grating and the transparent member. The OLED can prevent image spreading and deterioration in color purity while having enhanced light coupling efficiency.

21 Claims, 4 Drawing Sheets

U.S. PATENT DOCUMENTS

| | | | |
|---|---|---|---|
| 6,787,796 B2* | 9/2004 | Do et al. | 257/40 |
| 6,858,983 B2* | 2/2005 | Mochizuki et al. | 313/512 |
| 6,900,457 B2* | 5/2005 | Toguchi et al. | 257/40 |
| 2003/0136959 A1* | 7/2003 | Araki | 257/40 |
| 2004/0069985 A1* | 4/2004 | Cok | 257/40 |
| 2005/0077820 A1* | 4/2005 | Onishi et al. | 313/506 |

FOREIGN PATENT DOCUMENTS

| | | |
|---|---|---|
| CN | 1423510 A | 6/2003 |
| JP | 2991183 | 10/1999 |
| KR | 10-0379396 | 3/2002 |
| KR | 10-2003-0029467 | 4/2003 |
| KR | 2003-0026450 | 4/2003 |

OTHER PUBLICATIONS

Notice to Submit Response issued by Korean Intellectual Property Office dated Apr, 27, 2006 for KR application No. 10-2004-0079239.
First Office Action for Chinese Patent Application No. 200510107099.6 by Patent Office of the People's Republic of China dated Jun. 20, 2008.

* cited by examiner

ORGANIC LIGHT EMITTING DEVICE AND METHOD OF MANUFACTURING THE SAME

CROSS-REFERENCE TO RELATED PATENT APPLICATIONS

This application claims the benefit of Korean Patent Application Nos. 10-2004-0079239 and 10-2004-0079240, filed on Oct. 5, 2004, in the Korean Intellectual Property Office, the disclosures of which are incorporated herein in their entirety by reference.

BACKGROUND OF THE INVENTION

1. Field of the Invention

The present invention relates to an organic light emitting device and a method for manufacturing the same. More particularly, the invention relates to an organic light emitting device which can prevent image spreading and deterioration in color purity while having enhanced light coupling efficiency, and a method for manufacturing the same.

2. Description of the Related Technology

In general, a light emitting device is a self-emissive device, and has various advantages including a wide viewing angle, excellent contrast and a fast response speed.

The light emitting device (LED) is classified into an inorganic LED and an organic LED according to materials that form an emission layer. Generally, the organic LED (OLED) exhibits better characteristics than the inorganic LED in that it has excellent brightness, a low drive voltage and a fast response speed and enables multiple color display.

An OLED is generally constructed such that an anode is formed on a substrate, and a light emitting portion including at least an emission layer and a cathode are sequentially formed on the anode. The light emitting portion may further include a hole transport layer and an electron transport layer in addition to the emission layer. The hole transport layer, the emission layer and the electron transport layer are organic thin films made of organic compounds.

Light efficiency of an OLED typically includes internal luminous efficiency and external luminous efficiency. The internal luminous efficiency depends upon photoelectric conversion efficiency of organic compounds forming organic layers, including a hole transport layer, an emission layer, an electron transport layer, and so on. The external luminous efficiency (to be referred to as "light coupling efficiency" hereinafter) depends upon the refractive index of each layer.

Compared to the light coupling efficiency of a cathode ray tube (CRT), a plasma display panel (PDP), a field emitter display (FED) or other display devices, the light coupling efficiency of an organic LED is relatively low. This is because while passing through various layers of the device, the light generated from a light emitting portion may become extinct within the device without being transmitted to the air due to total internal reflection. In a rear-emission type OLED, for example, light generally travels in three modes: i) an anode/light emitting portion mode in which light generated at a light emitting portion is totally reflected at an anode/substrate interface to then be guided to the anode or the light emitting portion; ii) a substrate mode in which the generated light is totally reflected at a substrate/air interface to then be guided to the substrate; and iii) an external mode in which the generated light is transmitted to the outside. In an OLED using a 200 nm thick ITO layer, it is known that about 45.2% of light generated at a light emitting portion is associated with the anode/light emitting portion mode, about 31.1% is associated with the substrate mode, and about 23.5% is associated with the external mode. In other words, the light coupling efficiency of a typical OLED is very low, that is, approximately 23%.

One among various attempts to enhance light coupling efficiency of an OLED is associated with the use of diffractive gratings. For example, Korean Patent Publication No. 10-0379396 discloses an OLED panel comprising a substrate having grooves (diffractive gratings) with a predetermined depth, the grooves spaced a predetermined interval apart from each other, an anti-waveguide layer formed in an area where the grooves are formed, a first electrode formed on the entire surface of the substrate, barriers formed on the anti-wave guiding layer, and an organic light emitting layer and a second electrode sequentially formed on the barriers and the first electrode.

Korean Patent Publication No. 2003-0026450 discloses a photonic crystal organic LED comprising a transparent substrate having irregularities formed thereon, a transparent electrode layer formed on the organic substrate, a hole transport organic light emitting layer formed on the transparent electrode layer, an electron transport organic light emitting layer formed on the hole transport organic layer, and a cathode layer formed on the electron transport organic layer.

Japanese Patent No. 2991183 discloses an LED having a stacked structure in which a transparent substrate, a diffraction grating, a transparent electrode, an organic layer, and a reflective electrode are sequentially stacked in that order.

Such a diffraction grating diffracts some of the light guided in the anode/light emitting portion mode to make the same incident into the anode/substrate interface at an angle smaller than a critical angle of total internal reflection to then be externally transmitted. The light that is not transmitted to the outside is guided to and travels along the anode and the light emitting portion. However, the guided light cannot travel to an adjacent pixel due to a pixel define layer (PDL) disposed in the anode/light emitting portion. Even when the guided light can travel to an adjacent pixel, the traveling light is mostly absorbed into the anode and the light emitting portion and then become extinct, thereby exerting substantially no effect on the adjacent pixel.

However, the light that is totally reflected at the substrate/air interface and guided in the substrate mode travels to an adjacent pixel where the guided light is subsequently transmitted to the outside. This is because a PDL for blocking traveling of light is not formed in the substrate, unlike in the anode and the light emitting portion, and the guided light is not removed from the substrate due to a very low light absorption efficiency of the substrate. The light having reached the adjacent pixel is transmitted to the outside by means of a diffraction grating provided at the adjacent pixel, resulting in image spreading and deterioration in color purity and ultimately lowering picture quality of an organic light emitting device.

SUMMARY OF CERTAIN INVENTIVE ASPECTS

One aspect of the present invention provides an organic light emitting device which can prevent image spreading and deterioration in color purity while having enhanced light coupling efficiency, and a method for manufacturing the same.

Another aspect of the present invention provides an organic light emitting device including i) a pixel layer having a first electrode, a second electrode and a light emitting portion interposed between the first electrode and the second electrode and having at least an emission layer, ii) a transparent member disposed in a direction in which light generated from the pixel layer is transmitted to the outside, iii) a diffraction grating disposed between the pixel layer and the transparent member, and iv) a low-refractive layer made of a material having a refractive index less than that of a material forming the transparent member, the low-refractive layer disposed between the diffraction grating and the transparent member.

In one embodiment, the transparent member, the low-refractive layer, the diffraction grating, the first electrode, the light emitting portion and the second electrode may be sequentially stacked in that order, the transparent member may be a substrate, and the first electrode may be a transparent electrode.

In one embodiment, the first electrode, the light emitting portion, the second electrode, the diffraction grating, the low-refractive layer and the transparent member may be sequentially stacked in that order, the second electrode may be a transparent electrode, and the transparent member may be a protective layer or a seal member.

In one embodiment, the transparent member may be made of glass or a plastic material.

In one embodiment, the refractive index of a material forming the low-refractive layer may be in a range of about 1 to about 1.5.

In one embodiment, the material forming the low-refractive layer is porous $SiO_2$.

In one embodiment, the low-refractive layer may have a thickness in a range of about 100 nm to about 1000 nm.

In one embodiment, the diffraction grating may have protrusions shaped of a line, a rectangular pillar or a cylinder.

In one embodiment, a pitch between the protrusions of the diffraction grating is approximately ¼ to 4 times a wavelength of light generated from the light emitting portion.

In one embodiment, the first electrode may be made of ITO, IZO, ZnO, or $In_2O_3$.

In one embodiment, the second electrode may be made of at least one selected from the group consisting of Li, Ca, Al, Ag, Mg, and a combination of at least two of these materials.

Another aspect of the present invention provides an organic light emitting device including i) a pixel layer having a first electrode, a second electrode, and a light emitting portion interposed between the first electrode and the second electrode and having at least an emission layer, ii) a transparent member disposed in a direction in which light generated from the pixel layer is transmitted to the outside, iii) a diffraction grating disposed between the pixel layer and the transparent member, iv) a low-refractive layer made of a material having a refractive index less than that of a material forming the transparent member, the low-refractive layer disposed between the diffraction grating and the transparent member, and v) a light-absorbing layer disposed between the low-refractive layer and the transparent member.

In one embodiment, the transparent member, the light-absorbing layer, the low-refractive layer, the diffraction grating, the first electrode, the light emitting portion and the second electrode may be sequentially stacked in that order, the transparent member may be a substrate, and the first electrode may be a transparent electrode.

In one embodiment, the first electrode, the light emitting portion, the second electrode, the diffraction grating, the low-refractive layer, the light-absorbing layer and the transparent member may be sequentially stacked in that order, the second electrode may be a transparent electrode, and the transparent member may be a protective layer or a seal member.

In one embodiment, the transparent member may be made of glass or a plastic material.

In one embodiment, the refractive index of a material forming the low-refractive layer may be in a range of about 1 to about 1.5.

In one embodiment, the material forming the low-refractive layer is porous $SiO_2$.

In one embodiment, the low-refractive layer may have a thickness in a range of about 100 nm to about 1000 nm.

In one embodiment, the absorption coefficient of a material forming the light-absorbing layer may be in a range of about 0.01 to about 0.05.

In one embodiment, the light-absorbing layer may be made of $TiO_2$, $Ta_2O_5$ or $Nb_2O_5$.

In one embodiment, the light-absorbing layer may have a thickness in a range of about 50 nm to about 1 μm.

In one embodiment, the diffraction grating may have protrusions shaped of a line, a rectangular pillar or a cylinder.

In one embodiment, a pitch between the protrusions of the diffraction grating is approximately ¼ to 4 times a wavelength of light generated in the light emitting portion.

Still another aspect of the present invention provides a method of manufacturing an organic light emitting device including forming a low-refractive layer on a substrate, forming a diffraction grating on the low-refractive layer, and forming a pixel layer having a first electrode, a second electrode and a light emitting portion interposed between the first electrode and the second electrode and having at least an emission layer on the diffraction grating.

Yet another aspect of the present invention provides a method of manufacturing an organic light emitting device including forming a light-absorbing layer on a substrate, forming a low-refractive layer on the light-absorbing layer, forming a diffraction grating on the low-refractive layer, and forming a pixel layer having a first electrode, a second electrode and a light emitting portion interposed between the first electrode and the second electrode and having at least an emission layer on the diffraction grating.

In one embodiment, the diffraction grating may be formed by patterning a plane of the low-refractive layer in a direction of the light emitting portion.

In one embodiment, the patterning may include coating a photoresist layer on the low-refractive layer and patterning the resultant structure using an electron beam method or a laser hologram method.

BRIEF DESCRIPTION OF THE DRAWINGS

Embodiments of the present invention will be described with reference to the attached drawings.

DETAILED DESCRIPTION OF CERTAIN INVENTIVE EMBODIMENTS

Organic light emitting devices according to embodiments of the present invention will now be described in detail with reference to the accompanying drawings.

In one embodiment, an organic LED (OLED) includes i) a pixel layer ii) a transparent member through which light is emitted to the outside, iii) a diffraction grating disposed between the pixel layer and the transparent member, and iv) a low-refractive layer made of a material having a refractive index less than that of a material forming the transparent member, the low-refractive layer disposed between the diffraction grating and the transparent member.

In one embodiment, the light guided to the pixel layer has an incident angle smaller than a critical angle of total internal reflection by use of the diffraction grating. Thus, the guided light can be transmitted to the outside of the transparent member. Accordingly, in one embodiment, the OLED has a high level of light coupling efficiency.

In one embodiment, the low-refractive layer reduces a proportion of the light guided to the transparent member of the OLED. Therefore, image spreading and deterioration in color purity due to the guided light can be minimized or avoided.

Figure 1:
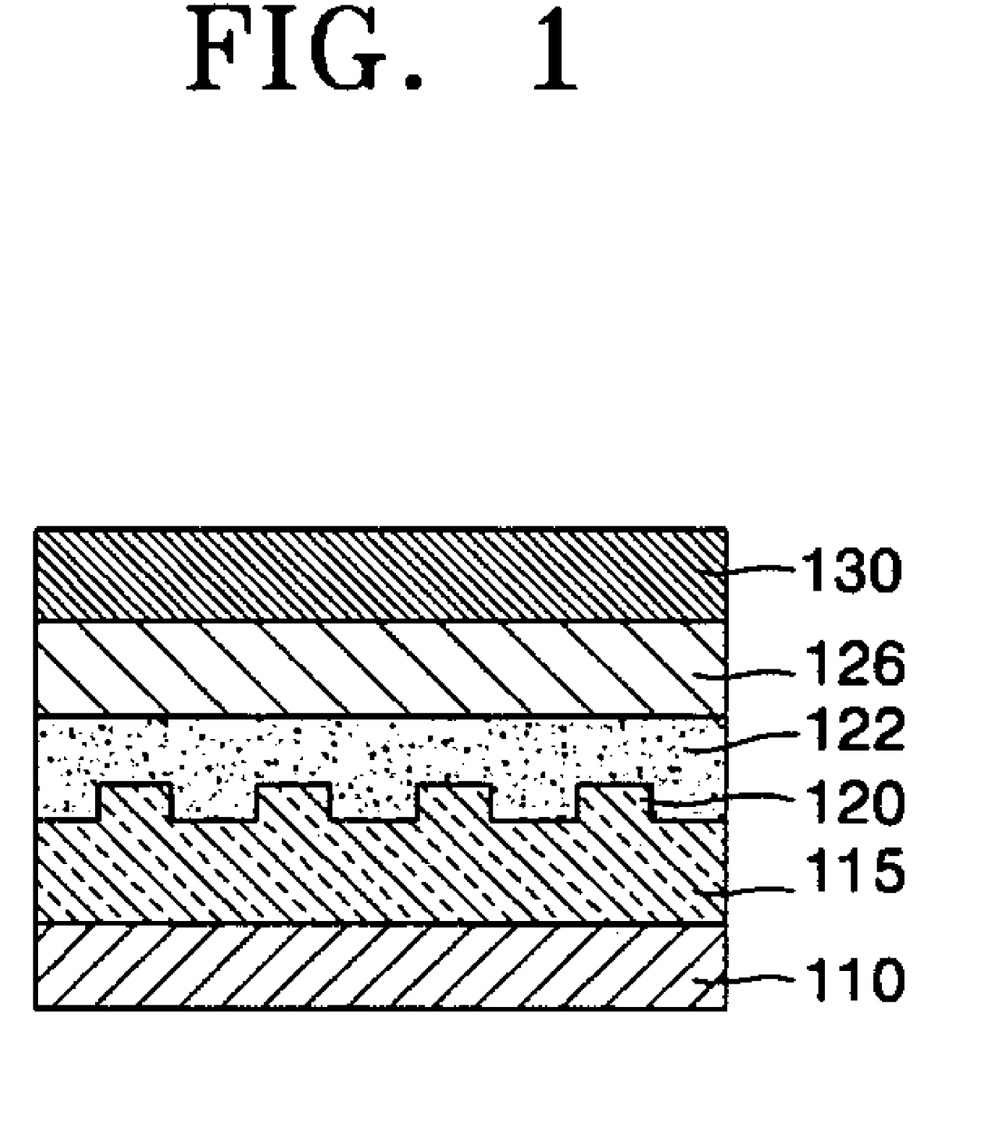
FIG. 1 is cross-sectional view schematically showing an organic light emitting device according to an embodiment of the present invention.

FIG. 1 is cross-sectional view schematically showing an organic light emitting device (OLED) according to an embodiment of the present invention. A first electrode 122, a light emitting portion 126 and a second electrode 130 generally forms a pixel layer. In one embodiment, the first electrode 122 is a transparent electrode and the above transparent member corresponds to a substrate 110. Thus, the light generated in the light emitting portion 126 is transmitted to the outside of the substrate 110. The FIG. 1 embodiment shows a rear-emission OLED, where light is emitted toward the rear side of the light emitting portion 126, i.e., light is passing through the first electrode 122 in FIG. 1.

In one embodiment, the OLED has a low-refractive layer 115 on a first plane of the substrate 110. Furthermore, as shown in FIG. 1, the first electrode 122, the light emitting portion 126 and the second electrode 130 are sequentially stacked on the low-refractive layer 115. In one embodiment, a diffraction grating 120 (grooves or protrusions) is formed between the low-refractive layer 115 and the first electrode 122. In one embodiment, a seal member (not shown) for sealing, from the outside, i) the first electrode 122, ii) the light emitting portion 126, and iii) the second electrode 130 may further be provided on the second electrode 130.

In one embodiment, a transparent glass substrate having silicon oxide as a main component may be used as the substrate 110. In order to achieve smoothness of the substrate 110 and to prevent impurities from being infiltrated into substrate 110, in one embodiment, a buffer layer (not shown) made of, for example, silicon oxide may further be provided on the substrate 110. In another embodiment, a flexible, plastic material may also be used as the substrate 110.

In one embodiment, the low-refractive layer 115 is made of a material having a refractive index less than that of the substrate 110 to reduce the amount of light generated from the light emitting portion 126 and guided to the substrate 110. In such a manner, the light guided to the substrate 110 travels through the substrate 110 so that the amount of the light traveling to the adjacent pixel area is noticeably reduced, thereby significantly reducing image spreading and deterioration in color purity.

Figure 2A:
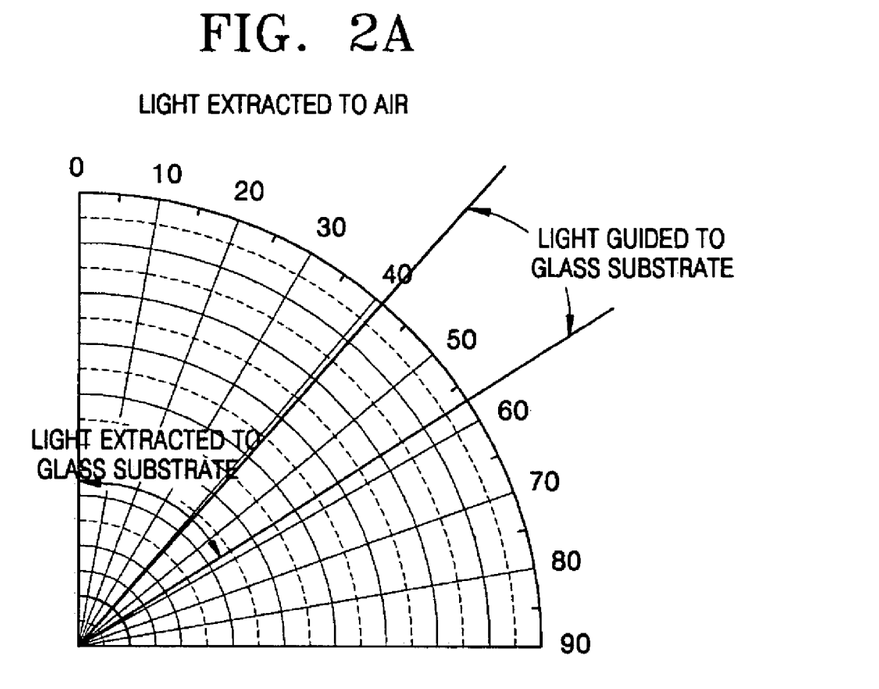
FIGS. 2A and 2B illustrate analysis results of interlayer critical angles in a device without a low-refractive layer and a device with a low-refractive layer.
Figure 2B:
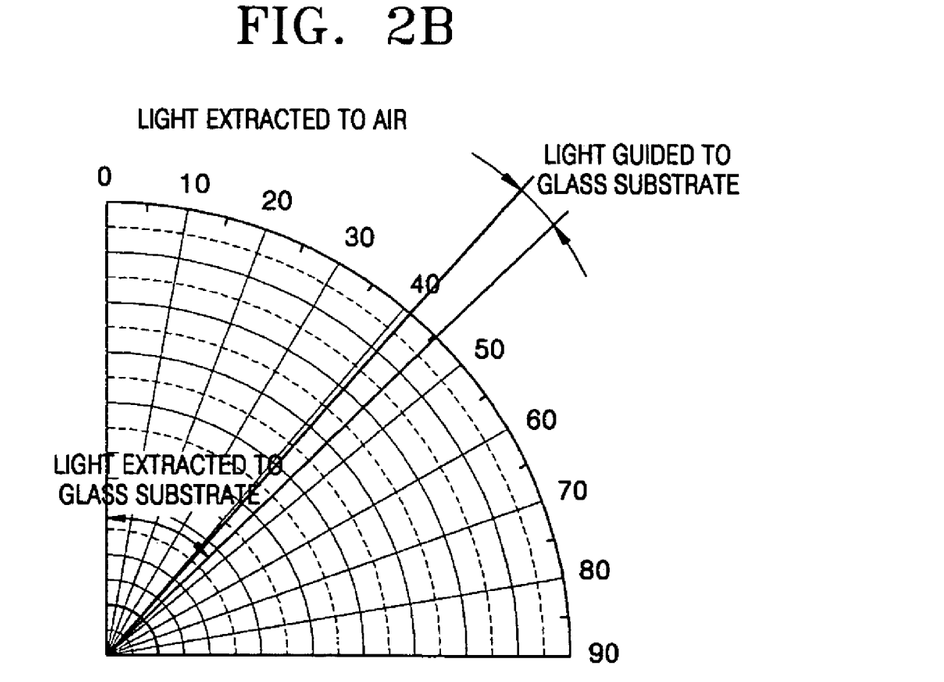

An effect of reducing the amount of the light guided to the substrate 110 by providing the low-refractive layer 115 can be confirmed by a critical angle analysis experiment that follows. Target devices of critical angle analysis include exemplary devices 1 and 2. The device 1 comprises a glass substrate, a 150 nm thick ITO layer, a 1500 Å thick EL layer, and a 3000 Å thick Al layer. The device 2 has the same configuration as the device 1 and further comprises a 500 nm thick low-refractive layer disposed between a substrate and an ITO layer and having a refractive index of 1.24. Critical angles of the devices 1 and 2 were analyzed. FIGS. 2A and 2B illustrate analysis results of interlayer critical angles in a device (Device 1) without a low-refractive layer and a device (Device 2) with a low-refractive layer. Referring to FIG. 2A, since critical angles at an ITO/substrate interface and a substrate/air interface are 58 degrees and 41 degrees, respectively, the light at an angle between 41 degrees and 58 degrees is guided to the substrate 110. In contrast, referring to FIG. 2B, since a critical angle at an ITO/low-refractive layer interface is 44 degrees, only the light at an angle between 41 degrees and 44 degrees is guided to the substrate 110.

A Finite Difference Time Domain (FDTD) simulation was performed on the devices 1 and 2 and a result thereof is shown below.

TABLE 1

|  | Device 1 | Device 2 |
|---|---|---|
| ITO/light emitting portion mode | 33% | 54% |
| Substrate mode | 41% | 22% |
| External mode | 26% | 24% |

Referring to Table 1, the amount of light guided to the substrate in a substrate mode in the device 1 was 41%, while that of the device 2 was at most 22%. This suggests that the low-refractive layer 115 noticeably reduced a proportion of light guided to the substrate, thereby significantly reducing image spreading and deterioration in color purity. In one embodiment, the low-refractive layer 115 may be made of a material having a refractive index in a range between about 1 and about 1.5. The refractive index value of 1 is associated with the absolute refractive index of air and the refractive index value of 1.5 is associated with the absolute refractive index of silicon oxide, which is typically used as the substrate 110.

In one embodiment, the low-refractive layer 115 may be formed of porous $SiO_2$. In one embodiment, the porous $SiO_2$ is silica xerogel or silica aerogel.

The silica aerogel is a material having a porous reticular structure of silica strands having a thickness of several nanometers. That is, the silica aerogel is an ultra-porous material having porosity of approximately 80% to approximately 99% and a pore size in a range of about 1 nm to about 50 nm and has high specific surface area ($\geq 700$ $m^2/g$). In one embodiment, a method of preparing silica aerogel includes preparing a wet gel by a sol-gel processing reaction, and drying the wet gel, and may be performed in variable manners according to kinds of silica aerogel.

In one embodiment, the low-refractive layer 115 may have a thickness in a range of about 100 nm to about 1000 nm. If the thickness of the low-refractive layer 115 is less than about 100 nm, the effect of reducing the amount of light guided to the substrate may be substantially low. If the thickness of the low-refractive layer 115 is greater than 1000 nm, cracks may be created in the low-refractive layer 115 and the production cost and time may increase.

The first electrode 122 made of a transparent conductive material is formed on the low-refractive layer 115. In one embodiment, the first electrode 122 is formed of ITO, IZO, ZnO, and In$_2$O$_3$. In one embodiment, a predetermined pattern is formed on the first electrode 122 by photolithography. In this embodiment, the predetermined pattern of the first electrode 122 may be formed by striped lines spaced a predetermined distance apart from one another in a case of a passive matrix (PM) type, and may correspond to pixels in a case of an active matrix (AM) type. In the AM type, a thin film transistor (TFT) layer (not shown) having at least one TFT may further be provided between the first electrode 122 and the substrate 110. The first electrode 122 is electrically connected to the TFT layer. The first electrode 122 is connected to an external first electrode terminal (not shown) to serve as an anode.

In one embodiment, a diffraction grating 120 (see FIG. 1) is formed between the first electrode 122 and the low-refractive layer 115. In one embodiment, as shown in FIG. 1, the diffraction grating 120 may be formed directly at an interface between the low-refractive layer 115 and the first electrode 122. In another embodiment, a new diffraction grating layer (not shown) may be interposed between the low-refractive layer 115 and the first electrode 122.

Figure 3:
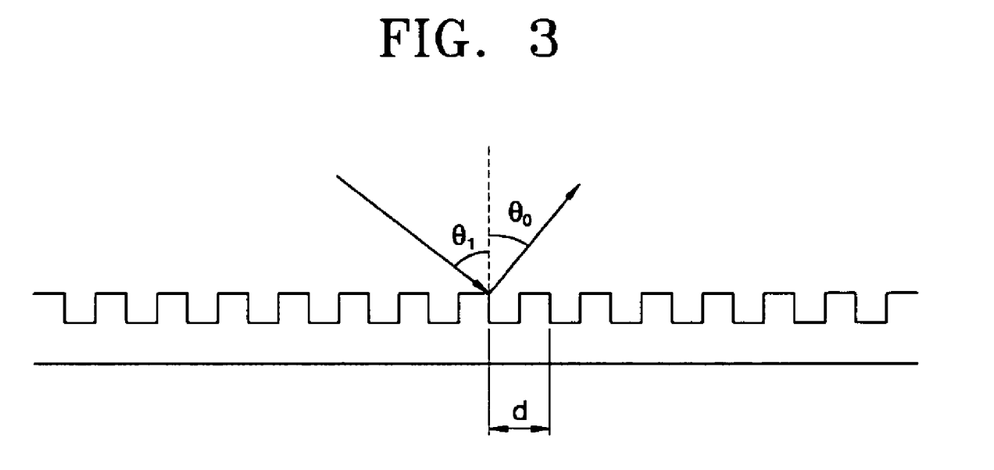
FIG. 3 is a conceptual diagram illustrating a diffraction grating according to an embodiment of the present invention and a change in the light path caused by the diffraction grating.

FIG. 3 is a conceptual diagram illustrating a diffraction grating according to an embodiment of the present invention and a change in the light path caused by the diffraction grating. As shown in FIG. 3, when light incident at an angle of $\theta_i$ is reflected by the diffraction grating, the following equation is obtained:

$$nd(\sin \theta_i - \sin \theta_o) = k\lambda \qquad \text{<Equation 1>}$$

wherein k denotes a number of diffraction order, $\theta_o$ denotes a reflection angle, d denotes a pitch between protrusions of the diffraction grating, $\lambda$ denotes a wavelength of the incident light, and n denotes a refractive index of the diffraction grating 120. The reflection angle $\theta_o$ can be adjusted by adjusting the pitch between the protrusions, i.e., "d." Therefore, the amount of light transmitted to the outside of the substrate 110 can be increased by changing the light incident at an angle greater than the critical angle to be smaller than the critical angle using the diffraction grating 120.

In one embodiment, the protrusions or grooves of the diffraction grating 120 may be formed in various shapes. Examples of the shapes of the protrusions include, but not limited to, a line, a rectangular pillar, a cylinder, a web, and so on.

A pitch between each of the protrusions of the diffraction grating 120 may be set to be about ¼ to about 4 times a wavelength of light generated from the light emitting portion 126. The reason of the foregoing is to control an angle of incidence of the light generated from the light emitting portion 126 to be smaller than the critical angle by means of the diffraction grating 120. If the pitch between each of the protrusions of the diffraction grating 120 is greater than 4 times the wavelength of light generated from the light emitting portion 126, the extent of light diffracted is reduced, that is, the angle of light diffracted is not sufficiently reduced to be smaller than the critical angle of the diffraction grating 120. If the pitch between each of the protrusions of the diffraction grating 120 is less than about ¼ times the wavelength of light generated in the light emitting portion 126, only a smaller amount of light passes through the diffraction grating 120, which may lower the light coupling efficiency. In a case where the protrusions are shaped of a rectangular pillar, the pitch between each of the protrusions of the diffraction grating 120 corresponds to d, as shown in FIG. 3. It can be easily appreciated by one skilled in the art that the protrusions of the diffraction grating 120 may have various shapes other than the rectangular pillar shape.

The second electrode 130 may be a transparent electrode or a reflective electrode. In one embodiment, the second electrode 130 may be made of a metal having a low work function, e.g., Li, Ca, Al, Ag, Mg, and combinations of at least two of these metals. The second electrode 130 is electrically connected to an external second electrode terminal and may serve as a cathode.

When the second electrode 130 is a PM type, it can be formed by striped lines perpendicular to the patterns of the first electrode 122. When the second electrode 130 is an AM type, it can be formed to correspond to pixels. In the latter case, the second electrode 130 may be formed over the entire active area where an image is displayed.

The first electrode 122 and the second electrode 130 may have opposite polarities to each other.

The light emitting portion 126 is provided between the first electrode 122 and the second electrode 130. In one embodiment, the light emitting portion 126 may be made of a low-molecule organic material or a polymeric organic material. When the light emitting portion 126 is made of a low-molecule organic material, it may have a single- or multiple-layered stack including a hole injection layer (HIL), a hole transport layer (HTL), an emission layer (EML), an electron transport layer (ETL), an electron injection layer (EIL), and so on. Examples of the usable organic material include copper phthalocyanine (CuPc), N,N'-Di(naphthalene-1-yl)-N,N'-diphenyl-benzidine (NPB), tris-8-hydroxyquinoline aluminum (Alq3), and so on. The low-molecule organic material may be formed by vacuum deposition.

When the light emitting portion 126 is made of a polymeric organic material, it may have a structure consisting of a hole transport layer (HTL), and an emission layer (EML). In one embodiment, PEDOT (Poly-3,4-Ethylenedioxythiophene) is used as the hole transport layer and a polymeric organic material based on PPV (polyphenylenevinylene) or polyfluorene is used as the emission layer (EML). Here, screen printing or inkjet printing may be employed in forming the light emitting portion 126 using the polymeric organic material. The forming of the organic emission layer is not limited to the method stated above and various modifications may be embodied.

Figure 4:
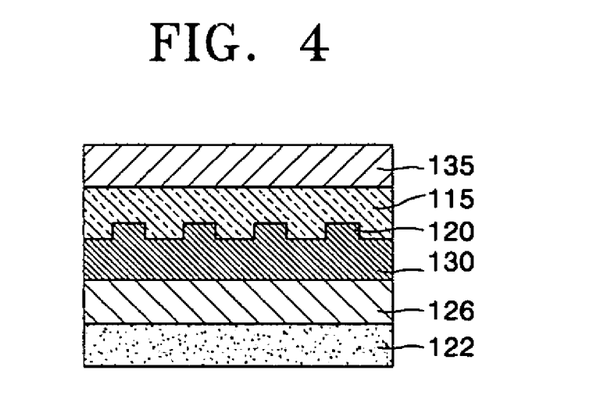
FIGS. 4 through 6 are cross-sectional views schematically showing organic light emitting devices according to another embodiments of the present invention.

FIG. 4 is a cross-sectional view schematically showing an organic light emitting device according to another embodiment of the present invention. The FIG. 4 embodiment shows a front-emission OLED, where light is emitted toward the front side of the light emitting portion 126, i.e., light is passing through the second electrode 130. A first electrode 122, a light emitting portion 126 and a second electrode 130 form a pixel layer. In this embodiment, the second electrode 130 is a transparent electrode through which light passes. Furthermore, a transparent seal member 135 is formed on the low-refractive layer 115. Thus, light generated in the light emitting portion 126 is transmitted to the outside of the seal member 135.

In one embodiment, a transparent glass substrate having silicon oxide as a main component may be used as the seal member 135. In order to protect the low-refractive layer 115 against moisture or oxygen permeating thereto, a protective layer (not shown), may further be provided on a bottom of the seal member 135. In one embodiment, the protective layer may be made of silicon oxide.

In this embodiment, the low-refractive layer 115 is formed on the second electrode 130. In one embodiment, the low-refractive layer 115 is made of a material having a refractive index less than that of the seal member 135, thereby reducing a proportion of light generated from the light emitting portion 126 and guided to the seal member 135. Accordingly, the amount of light which travels to an adjacent pixel area is noticeably reduced, thereby significantly reducing image spreading and deterioration in color purity. The low-refractive layer 115 is substantially the same as described above and a detailed explanation thereof will not be given.

In the FIG. 4 embodiment, the diffraction grating 120 is interposed between the low-refractive layer 115 and the second electrode 130. Based on the principle of increasing the light coupling efficiency using a diffraction grating, which has been described above with reference to FIG. 3, the diffraction grating 120 adjusts the light incident at an angle greater than the critical angle to be less than or equal to the critical angle, thereby increasing the amount of light transmitted to the outside of the seal member 135. The diffraction grating 120, the first electrode 122, the light emitting portion 126, and the second electrode 130 are the same as those described above and a detailed explanation thereof will not be provided.

Figure 5:
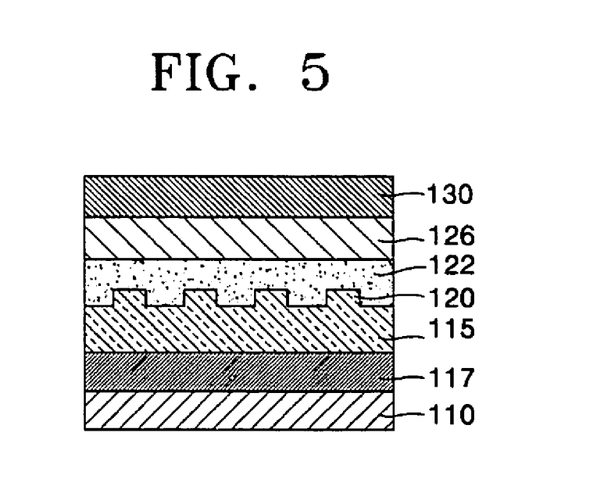

FIG. 5 is a cross-sectional view schematically showing an organic light emitting device according to another embodiment of the present invention. The FIG. 5 embodiment shows a rear-emission OLED as in the FIG. 1 embodiment. In this embodiment, as shown in FIG. 5, the OLED includes a light-absorbing layer 117 between the low-refractive layer 115 and the substrate 110. As discussed above, the low-refractive layer 115 significantly reduces the amount of light which travels to an adjacent pixel area on the substrate 110. However, there still may exist a certain amount of light which has been guided to the substrate 110. In this embodiment, the light-absorbing layer 117 absorbs the remaining guided light from the substrate 110 so that the guided light, traveling along the substrate 110, can quickly become extinct by means of the light-absorbing layer 117. Therefore, in this embodiment, a phenomenon that the light guided in the substrate mode travels to an adjacent pixel area, from which light is transmitted to the outside, can be substantially or completely avoided, thereby preventing image spreading and deterioration in color purity even more effectively.

In the FIG. 5 embodiment, the first electrode 122, the light emitting portion 126 and the second electrode 130 are sequentially stacked on the low-refractive layer 115 in that order. The diffraction grating 120 is formed between the low-refractive layer 115 and the first electrode 122. In one embodiment, a seal member (not shown) for sealing the elements 122, 126 and 130 from the outside may further be provided on the second electrode 130.

The substrate 110, the low-refractive layer 115, the first electrode 122, the diffraction grating 120 and the second electrode 130 are substantially the same as described above.

In one embodiment, the material forming the light-absorbing layer 117 has an absorption coefficient in a range of about 0.01 to about 0.05. If the absorption coefficient of the light-absorbing layer 117 is less than about 0.01, the effect of absorbing the light guided in the substrate mode is negligible. If the absorption coefficient of the light-absorbing layer 117 is greater than about 0.05, the light coupling efficiency may be undesirably lowered.

In one embodiment, the light-absorbing layer 117 may be formed of an inorganic thin film. Examples of the inorganic thin film include, but not limited to, $TiO_2$, $Ta_2O_5$, $Nb_2O_5$, and so on.

In one embodiment, the light-absorbing layer 117 has a thickness in a range of about 50 nm to about 1 µm. If the thickness of the light-absorbing layer 117 is less than about 50 nm, the effect of absorbing the light guided in the substrate mode is negligible. If the thickness of the light-absorbing layer 117 is greater than about 1 µm, the light coupling efficiency may be undesirably lowered.

In one embodiment, the light guided in the substrate mode, causing image spreading and deterioration in color purity, can be completely removed by the low-refractive layer 115 and the light-absorbing layer 117. Thus, the image spreading and deterioration in color purity can be avoided.

Figure 6:
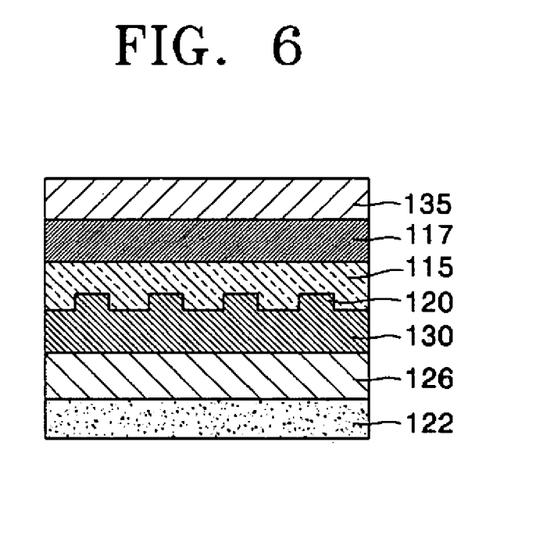

FIG. 6 is a cross-sectional view schematically showing an organic light emitting device according to still another embodiment of the present invention. The FIG. 6 embodiment shows a front-emission OLED as in the FIG. 4 embodiment. In this embodiment, the low-refractive layer 115, the light-absorbing layer 117, and the seal member 135 are sequentially formed on the second electrode 130. The diffraction grating 120 is disposed between the low-refractive layer 115 and the second electrode 130.

While embodiments have been described with respect to either rear- or front-emission OLED, they can also be applied to a wide variety of types of OLEDs, including a dual-side emission type.

A method of manufacturing an OLED according to one embodiment will be described with respect to FIG. 1. In one embodiment, the method includes i) forming a low-refractive layer 115 on a substrate 110, ii) forming a diffraction grating 120 on the low-refractive layer 115, and iii) forming a pixel layer having a first electrode 122, a second electrode 126 and a light emitting portion 126 interposed between the first and second electrodes 122 and 126 and having at least an emission layer. In one embodiment, the low-refractive layer 115 is formed on the substrate 110 by coating or deposition. In another embodiment, the low-refractive layer 115 can be formed by a different method according to materials used in forming the low-refractive layer 115. Thereafter, the diffraction grating 120 is formed on the low-refractive layer 115. In one embodiment, the diffraction grating 120 can be formed by way of a photolithography process using a photoresist film. In one embodiment, after forming the photoresist film on the low-refractive layer 115, the resultant structure is patterned by an E-beam or a laser hologram method, followed by etching the photoresist film using a developing solution. Then, the low-refractive layer 115 is etched using reactive ion etching (RIE), thereby completing the diffraction grating 120.

Next, the first electrode 122, the light emitting portion 126 and the second electrode 130 are sequentially formed. In one embodiment, the electrodes 122, 126 and light emitting portion 126 can be formed by way of deposition or coating according to materials for forming the elements 122, 126 and 130. In one embodiment, after forming the first electrode 122, a polishing process can be selectively employed.

A method of manufacturing an OLED according to another embodiment will be described with respect to FIG. 5. In one embodiment, the method includes forming a light-absorbing layer 117 on a substrate 110, forming a low-refractive layer 115 on the light-absorbing layer 117, forming a diffraction grating 120 on the low-refractive layer 115, and forming a pixel layer 122, 126 and 130.

In one embodiment, the light-absorbing layer 117 is first formed on the substrate 110 by deposition. In one embodiment, a suitable deposition method of forming the light-absorbing layer 117 can be selected according to materials used for forming the layer 117. The remaining elements 115, 122, 126 and 130 are formed in the same manner as discussed above.

While the methods of manufacturing the OLED have been described by way of example of a rear-emission OLED, the invention is not limited thereto. For example, the manufacturing method can be applied to a front-emission OLED as shown in FIGS. 4 and 6, and other type, for example, a dual-side emission OLED. In the above-described OLEDs, the effect of enhancing the light coupling efficiency and the effect of preventing image spreading and deterioration in color purity were evaluated through various examples and comparative examples. A structure of a sample prepared in the illustrative Example is schematically shown in FIG. 1. First, porous silica aerogel as a low-refractive layer 115 was coated on a glass substrate 110 to a thickness of 500 nm. The porous silica aerogel forming the low-refractive layer 115 has a refractive index of 1.24. Protrusions having a height of approximately 0.3 μm and spaced approximately 0.5 μm apart from one another were formed on the low-refractive layer 115. More specifically, a photoresist film was formed on the low-refractive layer 115 to a thickness of 0.2 μm, exposed, patterned, and developed, thereby forming irregularities having a height of 0.2 μm. Thereafter, the exposed silica aerogel is etched to a depth of 0.3 μm, and the remaining photoresist film was removed by dry etching, thereby forming the diffraction grating 120 on the low-refractive layer 115. Next, an ITO layer (first electrode; 122) was formed to a thickness of 200 nm, followed by polishing a top surface of the ITO layer 122. A 1500 Å thick EL layer (light emitting portion; 126) and a 3000 Å thick Al layer as a second electrode 130 were formed on the ITO layer 122. The resultant sample is referred to as Sample 1.

Figure 8:
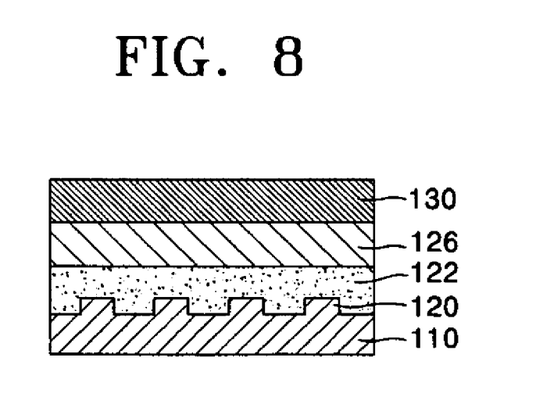
FIG. 8 is a cross-sectional view schematically showing an organic light emitting device having neither a low-refractive layer nor a light-absorbing layer.

In Comparative Example 1, a sample was prepared in the same manner as in Example (Sample 1) except that a low-refractive layer is not formed and a diffraction grating is formed on a substrate. The resultant sample is referred to as Sample A. A structure of the Sample A is schematically shown in FIG. 8. Referring to FIG. 8, the Sample A is constructed such that a substrate 110, a diffraction grating 120, a first electrode 122, a light emitting portion 126 and a second electrode 130 are sequentially stacked in that order.

Figure 7:
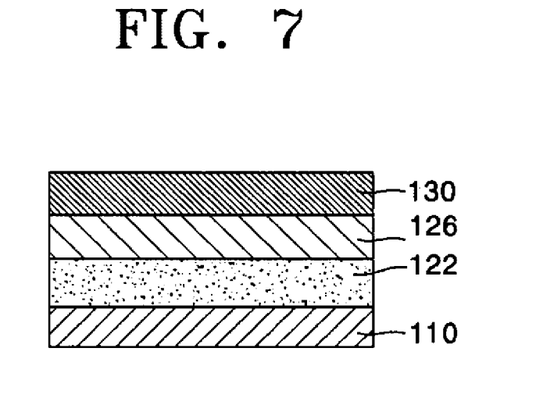
FIG. 7 is a cross-sectional view schematically showing an organic light emitting device with none of a diffraction grating, a low-refractive layer and a light-absorbing layer.

In Comparative Example 2 (Sample B; not shown in Table 2), a sample was prepared in the same manner as in Comparative Example 1 except that a diffraction grating is not formed. The resultant sample is referred to as Sample B. Referring to FIG. 7, the Sample B is constructed such that a substrate 110, a first electrode 122, a light emitting portion 126 and a second electrode 130 are sequentially stacked in that order.

FDTD simulation was performed on Sample 1, Sample A and Sample B, and light coupling efficiency enhancing ratios and image spreading ratios of Sample A and Sample 1 were calculated. The calculation results are shown in Table 2. The light coupling efficiency enhancing ratios were calculated based on the amount of light extracted from Sample B having neither a diffraction grating nor a low-refractive layer. Meanwhile, when an electric field is applied to a predetermined pixel layer area in either Sample A or 1, the term "image spreading ratio" is used to represent a ratio of the amount of light emitted from the predetermined pixel layer area to the amount of light emitted from a pixel layer area other than the predetermined pixel layer area.

TABLE 2

|  | Sample A (Comparative Example 1) | Sample 1 (Example) |
|---|---|---|
| Light coupling efficiency enhancing ratio | 30% | 50% |
| Image spreading ratio | 10% | 4% |

As shown in Table 2, the light coupling efficiency enhancing ratio of Sample 1 is 50%, which is higher than that of Sample A, i.e., 30%. The image spreading ratio of Sample 1 is 4%, which is much smaller than that (10%) of Sample A. This confirms that Sample 1 comprising a diffraction grating and a low-refractive layer according to the present invention has an enhanced light coupling efficiency and reduced image spreading. Next, the light coupling efficiency enhancing effect and the effect of preventing image spreading and deterioration in color purity will be described with reference to the FIG. 5 embodiment.

A structure of a sample prepared in the illustrative Example is schematically shown in FIG. 5. First, TiO$_2$ as a light-absorbing layer 117 was formed on a glass substrate 110 to a thickness of 500 nm. The absorption coefficient of the light-absorbing layer 117 is 0.01. The remaining conditions are the same as those of Sample 1. The resultant sample is referred to as Sample 2.

FDTD simulation was performed on Sample 2 and Sample A, and image spreading ratios of Sample 2 and Sample A were calculated. Here, Sample A has neither a light-absorbing layer nor a low-refractive layer. The calculation results are shown in Table 3. When an electric field is applied to a predetermined pixel layer area in either Sample 2 or A, the term "image spreading ratio" is used to represent a ratio of the amount of light emitted from the predetermined pixel layer area to the amount of light emitted from a pixel layer area other than the predetermined pixel layer area.

TABLE 3

|  | Sample 2 | sample A |
|---|---|---|
| Image spreading ratio | 0% | 10% |

Referring to Table 3, Sample A having neither a light-absorbing layer nor a low-refractive layer had an image spreading ratio of no less than 10%.

In contrast, Sample 2 having both a low-refractive layer and a light-absorbing layer had an image spreading ratio of 0%, that is, no image spreading occurred in Sample 2. Accordingly, it is confirmed that Sample 2 comprising the diffraction grating, low-refractive layer and light-absorbing layer according to one embodiment of the present invention can prevent image spreading and deterioration in color purity.

According to embodiments of the present invention, the OLED can prevent image spreading and deterioration in color purity while having improved light coupling efficiency. Thus, a relatively high level of brightness can be obtained from the same amount of power, thereby saving power consumption and achieving excellent picture quality. Accordingly, an OLED having enhanced reliability can be manufactured.

While the above description has pointed out novel features of the invention as applied to various embodiments, the skilled person will understand that various omissions, substitutions, and changes in the form and details of the device or process illustrated may be made without departing from the scope of the invention. Therefore, the scope of the invention is defined by the appended claims rather than by the foregoing description. All variations coming within the meaning and range of equivalency of the claims are embraced within their scope.

What is claimed is:

1. An organic light emitting device, comprising:
   a pixel layer including i) first and second electrodes and ii) a light emitting portion located between the electrodes;
   a transparent member through which light is transmitted;

a diffraction grating disposed between the pixel layer and the transparent member; and a low-refractive layer having a refractive index less than that of the transparent member, the low-refractive layer disposed between the diffraction grating and the transparent member.

2. The organic light emitting device of claim 1, wherein the transparent member, the low-refractive layer, the diffraction grating, the first electrode, the light emitting portion and the second electrode are sequentially stacked in that order, and wherein the transparent member is a substrate and the first electrode is a transparent electrode.

3. The organic light emitting device of claim 1, wherein the first electrode, the light emitting portion, the second electrode, the diffraction grating, the low-refractive layer and the transparent member are sequentially stacked in that order, and wherein the second electrode is a transparent electrode and the transparent member is a protective layer or a seal member.

4. An organic light emitting device, comprising:
a pixel layer including i) first and second electrodes and ii) a light emitting portion located between the electrodes;
a transparent member through which light is transmitted;
a diffraction grating disposed between the pixel layer and the transparent member;
a low-refractive layer having a refractive index less than that of the transparent member, the low-refractive layer disposed between the diffraction grating and the transparent member; and
a light-absorbing layer disposed between the low-refractive layer and the transparent member.

5. The organic light emitting device of claim 4, wherein the transparent member, the light-absorbing layer, the low-refractive layer, the diffraction grating, the first electrode, the light emitting portion and the second electrode are sequentially stacked in that order, and wherein the transparent member is a substrate and the first electrode is a transparent electrode.

6. The organic light emitting device of claim 4, wherein the first electrode, the light emitting portion, the second electrode, the diffraction grating, the low-refractive layer, the light-absorbing layer and the transparent member are sequentially stacked in that order, and wherein the second electrode is a transparent electrode and the transparent member is a protective layer or a seal member.

7. The organic light emitting device of claim 1, wherein the transparent member is formed of glass or a plastic material.

8. The organic light emitting device of claim 1, wherein the low-refractive layer has a refractive index in the range of about 1 to about 1.5.

9. The organic light emitting device of claim 1, wherein the low-refractive layer is formed of porous $SiO_2$.

10. The organic light emitting device of claim 1, wherein the low-refractive layer has a thickness in the range of about 100 nm to about 1000 nm.

11. The organic light emitting device of claim 4, wherein the light-absorbing layer has an absorption coefficient in the range of about 0.01 to about 0.05.

12. The organic light emitting device of claim 4, wherein the light-absorbing layer is formed of $TiO_2$, $Ta_2O_5$ or $Nb_2O_5$.

13. The organic light emitting device of claim 4, wherein the light-absorbing layer has a thickness in the range of about 50 nm to about 1 μm.

14. The organic light emitting device of claim 1, wherein the diffraction grating has protrusions shaped of a line, a rectangular pillar or a cylinder.

15. The organic light emitting device of claim 14, wherein a pitch between the protrusions of the diffraction grating is approximately ¼ to 4 times a wavelength of light generated from the light emitting portion.

16. The organic light emitting device of claim 1, wherein the first electrode is formed of ITO, IZO, ZnO, or $In_2O_3$.

17. The organic light emitting device of claim 1, wherein the second electrode is formed of at least one of the following: Li, Ca, Al, Ag, and Mg.

18. A method of manufacturing an organic light emitting device, comprising:
forming a low-refractive layer on a substrate, wherein the low-refractive layer has a refractive index less than that of the substrate;
forming a diffraction grating on the low-refractive layer; and
forming a pixel layer having a first electrode, a second electrode and a light emitting portion interposed between the first electrode and the second electrode and having at least an emission layer.

19. A method of manufacturing an organic light emitting device, comprising:
forming a light-absorbing layer on a substrate;
forming a low-refractive layer on the light-absorbing layer, wherein the low-refractive layer has a refractive index less than that of the substrate;
forming a diffraction grating on the low-refractive layer; and
forming a pixel layer having a first electrode, a second electrode and a light emitting portion interposed between the first electrode and the second electrode and having at least an emission layer.

20. The method of claim 18, wherein the diffraction grating is formed by patterning a plane of the low-refractive layer located in a direction of the light emitting portion.

21. The method of claim 20, wherein the patterning comprises coating a photoresist layer on the low-refractive layer and patterning the resultant structure with the use of an electron beam method or a laser hologram method.

* * * * *